United States Patent [19]
Maeda

[11] Patent Number: 5,450,428
[45] Date of Patent: Sep. 12, 1995

[54] PHASE-CONTINUOUS AND FREQUENCY-VARIABLE LIGHT SOURCE

[75] Inventor: Minoru Maeda, Tokyo, Japan

[73] Assignee: Ando Electric Co., Ltd., Tokyo, Japan

[21] Appl. No.: 303,487

[22] Filed: Sep. 9, 1994

[30] Foreign Application Priority Data

Sep. 30, 1993 [JP] Japan .................................. 5-268436

[51] Int. Cl.$^6$ ................................................ H01S 3/10
[52] U.S. Cl. .......................................... 372/20; 372/38
[58] Field of Search ..................... 372/38, 20, 32, 102

[56] References Cited

U.S. PATENT DOCUMENTS 4,971,415 11/1990 Hara et al. .............................. 372/17
5,325,382 6/1994 Emura et al. .......................... 372/38

*Primary Examiner*—Rodney B. Bovernick
*Assistant Examiner*—Robert E. Wise

*Attorney, Agent, or Firm*—Finnegan, Henderson, Farabow, Garrett & Dunner

[57] ABSTRACT

The purpose of the present invention is to provide a phase-continuous and frequency-variable light source without a decrease of phase-continuous width while scanning the optical frequency under different operating conditions and having the capability of varying the optical frequency with phase-continuity under the best conditions. In accordance with the phase-continuous and frequency-variable light source of the present invention, a beam splitter for splitting a forward-directed beam from an active region of the light source, a first beam detector for detecting a reflected beam from the beam splitter, and a second beam detector for detecting a backward-directed beam from a DBR region of the light source are provided and feedback control is conducted in a manner such that a ratio of a forward-directed optical output and a backward-directed optical output from the detectors is fixed to a predetermined value.

2 Claims, 4 Drawing Sheets

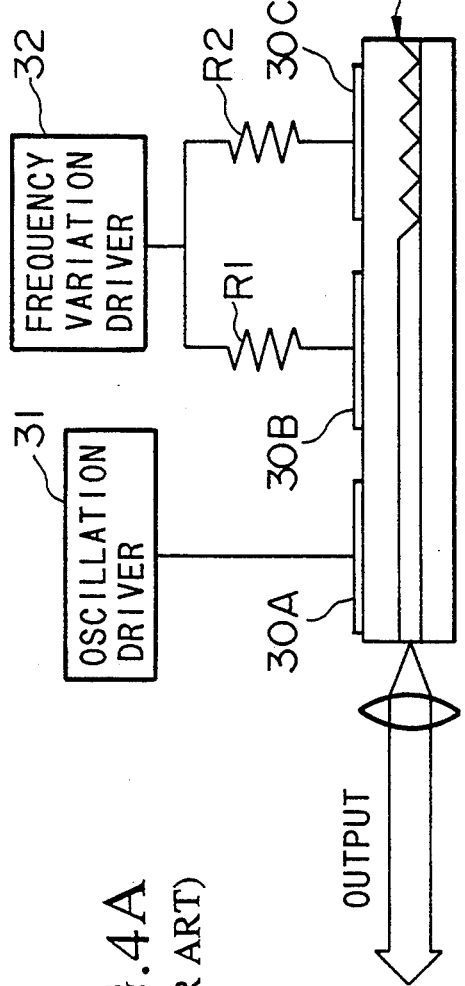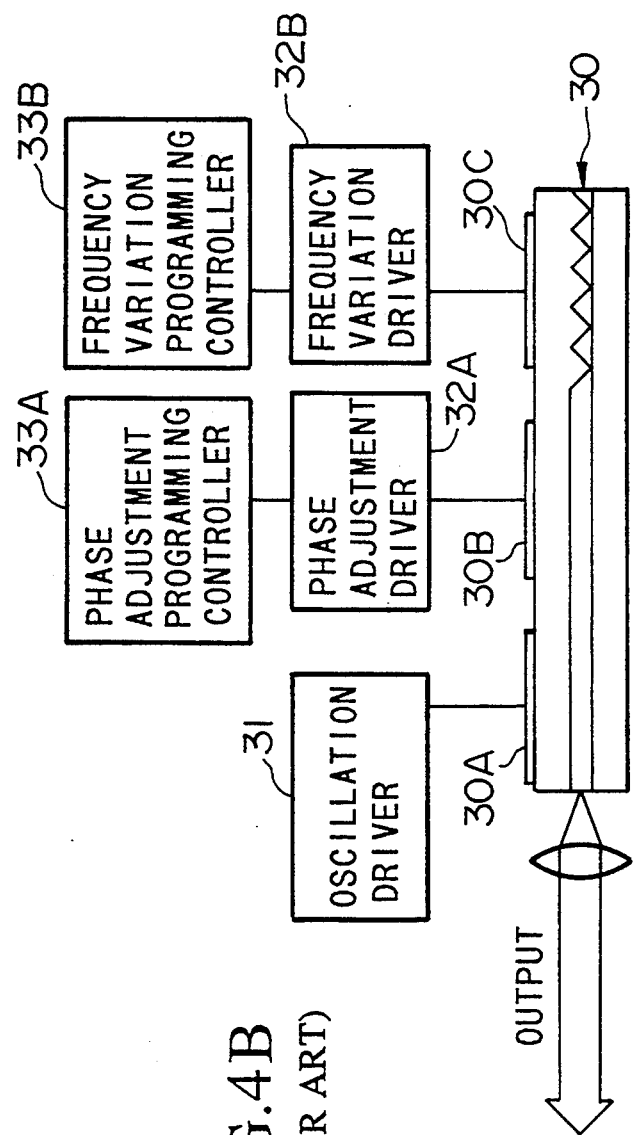
FIG.4A (PRIOR ART)
FIG.4B (PRIOR ART)

PHASE-CONTINUOUS AND FREQUENCY-VARIABLE LIGHT SOURCE

BACKGROUND OF THE INVENTION

Field of the Invention

The present invention relates to a phase-continuous and frequency-variable operation of frequency-variable light sources for optical coherent communication or optical coherent measurement.

Technical Background

As a frequency-variable light source which can vary a frequency of oscillation under a phase-continuous condition for optical coherent communication or measurement, TTG-LD (tunable twin guide—laser diode), three-electrode-type DBR-LD (distributed Bragg reflector—laser diode), multiple-electrode-type DFB—LD (distributed feedback—laser diode), and external resonator type laser diode, etc. have been developed.

Each of these frequency-variable light sources has some regions inside its resonator in which a diffraction grating region (DBR region) with selectivity for optical frequencies is one for determining Bragg wavelength $\lambda_B$. The frequency-variable light sources oscillate at an optical frequency close to Bragg wavelength $\lambda_B$, having small mirror-loss, and corresponding to a phase matching condition with regard to each optical resonator.

The three-electrode-type DBR-LD has three regions: an active region, a phase adjustment region, and a DBR region. It is necessary to fulfill a phase matching condition at these three regions so as to oscillate the three-electrodetype DBR-LD.

FIG. 3 shows the DBR reflective characteristic corresponding to Bragg wavelength $\lambda_B$ in the case in which current is not injected into the DBR region and the phase adjustment region. In FIG. 3, there are many longitudinal modes. However, when current is injected into the active region, the practical laser oscillation only occurs at an optical frequency of a longitudinal mode corresponding to a smallest mirror loss.

To obtain a frequency-variable function, refractive indexes of the DBR region and the phase adjustment region have to be changed by injecting current into these regions. If current is also injected into these regions while the laser light source is oscillating, the refractive index of the waveguide is altered by plasma effects or heating of carriers.

The optical frequency is varied by changing the refractive index at the DBR region having frequency-selectivity. In this case, the optical frequency is shifted to one corresponding to the condition that the reflectance of the reflective mirror is highest (i.e., the mirror loss of the resonator is lowest) by means of the injected current in the DBR region.

In addition, the current in the phase adjustment region is varied so as to satisfy a phase matching condition at an particular longitudinal mode.

If only the current in the DBR region is varied, the Bragg wavelength $\lambda_B$ varies according to the change of the refractive index of this diffraction grating region. However, only the Bragg wavelength $\lambda_B$ varies; the wavelengths of the longitudinal modes do not vary, so that the variation of the optical frequency is accompanied by a mode jump corresponding to the wavelengths of the longitudinal modes.

Similarly, if only the current in the phase adjustment region is varied, the wavelengths of the longitudinal modes vary according to the change of the refractive index of this region. However, in this case, Bragg wavelength $\lambda_B$ does not change, so that the shift of the optical frequency is shown only within longitudinal modes close to Bragg wavelength $\lambda_B$ while the mode jump is repeated.

Therefore, the variation of Bragg wavelength $\lambda_B$ by injecting current into the DBR region and the variation of the phase condition by injecting current into the phase adjustment region have to occur at the same time so as to vary the optical frequency smoothly at a fixed longitudinal mode.

Therefore, the phase-continuous frequency variation of the conventional three-electrode-type DBR-LD is conducted as follows:

Case (1)—See FIG. 4A

The current in phase adjustment region 30B and DBR region 30C of three-electrode-type DBR-LD 30 is divided by resistors R1 and R2 and the change of the current is controlled by a single driver, frequency variation driver (driving power circuit) 32.

Case (2)—See FIG. 4B

A phase adjustment driver 32A and a phase adjustment programming controller 33A, and, a frequency variation driver 32B and a frequency variation programming controller 33B are connected to phase adjustment region 30B and DBR region 30C respectively. Each region is programmatically controlled to be independently driven. In addition, oscillation driver 31 is connected to active region 30A.

In case (1), the rate of change with regard to the phase adjustment and the rate of change of Bragg optical frequency are different; thus, the maximum width for phase-continuous frequency variation is not always obtained in the light source.

In case (2), it is possible to obtain the maximum frequency variation by programmatically controlling each region by each driving power circuit. However, it is necessary to pre-examine the frequency-variable characteristic under working conditions of the light source. Therefore, it is not possible to operate the light source under different working conditions (with regard to temperature, driving current of oscillation, gradual wear of elements, etc.).

After all, in the resistive dividing type driving method or the programmatically driving method, phase-continuous width of the scanning of the optical frequency decreases when the frequency-variable light source is operated phase-continuously under the different working conditions.

In the above description, the frequency-variable light source using the three-electrode-type DBR-LD is explained. However, a frequency-variable light source using an external resonator type LD having an external diffraction grating, etc., has a similar structure and also needs angle adjustment for the diffraction grating and control of the length of the resonator.

SUMMARY OF THE INVENTION

In view of the above, the purpose of the present invention is to provide a phase-continuous and frequency-variable light source without a decrease of phase-continuous width while scanning the optical frequency under the different working conditions and having the capability of varying the optical frequency with phase-continuity under the best conditions.

In the present invention, feedback control is conducted in a manner such that a ratio of a forward-directed optical output and a backward-directed optical output from a frequency-variable light source is fixed to a predetermined value.

Therefore, the present invention provides a phase-continuous and frequency-variable light source having an active region, a phase adjustment region, and a DBR region having selectivity of optical frequencies, the phase-continuous and frequency-variable light source comprising: a beam splitter for splitting a forward-directed beam from the active region into an outputted beam and a reflected beam; a first beam detecting circuit for detecting the reflected beam from the beam splitter; a second beam detecting circuit for detecting a backward-directed beam from the DBR region; and a control circuit for controlling a phase condition of the phase adjustment region in a manner such that a ratio of optical outputs from the first and second beam detecting circuits is fixed to a predetermined value.

The present invention also provides an external resonator type phase-continuous and frequency-variable light source having an external resonator which includes a first beam splitter, a reflecting mirror, and a diffraction grating; wherein an output beam from an end face with an antireflection film of a laser diode of the light source is split by the first beam splitter so as to input the beam to the reflection mirror, and a reflected beam from the reflection mirror is transmitted through the first beam splitter so as to input the beam to the diffraction grating; the phase-continuous and frequency-variable light source comprising: a second beam splitter for splitting a forward-directed beam from the laser diode into an outputted beam and a reflected beam; a first beam detecting circuit for detecting one of the beams from the second beam splitter; a second beam detecting circuit for detecting a transmitted beam from the first beam splitter; and a control circuit for controlling a phase condition of the light source by sliding the reflecting mirror in parallel with the longitudinal direction of the external resonator so as to change the length of the resonator in a manner such that a ratio of optical outputs from the first and second beam detecting circuits is fixed to a predetermined value.

Among frequency-variable light sources, for example, the three-electrode-type DBR-LD including the DBR region with the selectivity of the optical frequency has a reflector using a cleavage plane of the LD on the side of the active region. Therefore, the active region does not have the selectivity of the optical frequency and has fixed reflectance.

However, the reflector on the side of the DBR region has the selectivity of the optical frequency by means of its diffraction grating; thus, the reflector has a variable reflectance with regard to the optical frequency characteristic. In this case, the light source oscillates at an optical frequency, close to Bragg wavelength $\lambda_B$, having small mirror-loss, and corresponding to a phase matching condition by the optical resonator. Therefore, the reflectance on the side of the DBR region varies in accordance with the phase condition of the oscillation frequency.

If only current in the DBR region is swept in a state of maintaining the driving current for the active region to be fixed, the Bragg wavelength $\lambda_B$ changes, but the phase condition does not change. Therefore, the reflectance on the side of the DBR region varies.

If the reflectance has varied towards high reflection, the optical output from the end face of the DBR region decreases and the optical output from the end face of the active region increases. On the other hand, if the reflectance has varied towards low reflection, the optical output from the end face of the DBR region increases and the optical output from the end face of the active region decreases. A similar phenomenon is produced if only the current in the phase adjustment region is changed.

Therefore, to realize phase-continuous and frequency variation, the variations of Bragg wavelength $\lambda_B$ and the phase condition must be conducted simultaneously. Otherwise, the ratio of beams in front and behind the LD varies.

Accordingly, by means of measuring the ratio of the beams in front and behind the LD and conducting the optical frequency variation under a feedback control of the phase condition in a manner such that the ratio of the beams is fixed to a predetermined value, it is possible to realize the phase-continuous and frequency variation while keeping a fixed phase matching condition.

The above description is also suitable for an external resonator type frequency-variable light source having a ROR (resonant optical reflector) structure, i.e., an external resonator including a reflecting mirror and a diffraction grating, which transforms a resonance characteristic to a reflective characteristic by a beam splitter with low reflectance, as an external reflector on the side of the antireflection film.

By means of measuring the ratio of the beams in front and behind the LD and conducting the optical frequency variation under a feedback control of the phase condition in a manner such that the ratio of the beams is fixed to a predetermined value, it is possible to realize the phase-continuous and frequency variation while maintaining a fixed phase matching condition.

Therefore, in the present invention, the decrease of the phase-continuous variable width associated with the change in operating conditions (such as temperature, driving current, and gradual wear of elements) of the frequency variable light source can be prevented; thus, the maximum phase-continuous frequency variation is obtained.

BRIEF EXPLANATION OF THE DRAWINGS

FIGS. 4A and 4B are block diagrams showing the configuration of the conventional phase-continuous and frequency-variable light sources.

DESCRIPTION OF THE PREFERRED EMBODIMENTS

Figure 1:
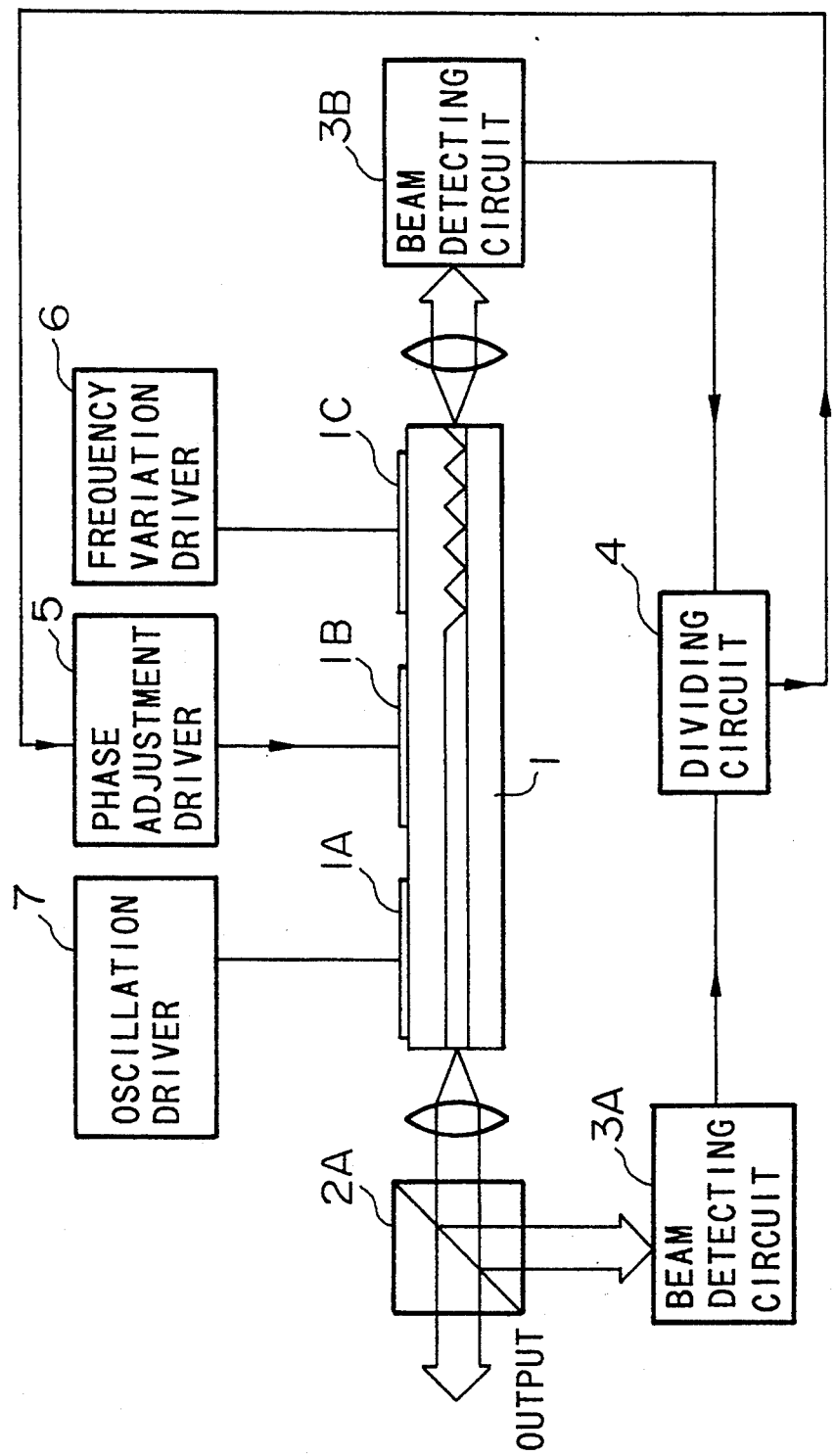
FIG. 1 is a block diagram showing the configuration of the phase-continuous and frequency-variable light source according to an embodiment of the present invention.

FIG. 1 is a block diagram showing the phase-continuous and frequency-variable light source according to an embodiment of the present invention.

In FIG. 1, a frequency-variable light source 1 is a three-electrode-type DBR-LD having three regions, an active region 1A for the LD oscillation, a phase adjustment region 1B in which a longitudinal mode for the oscillation can be adjusted, and a DBR region 1C at one side of the resonator which is a reflective region having selectivity of the optical frequency. The laser source oscillates by means of inspecting electric current into the active region 1A by oscillation driver 7.

Phase adjustment driver 5 and frequency variation driver 6 are also connected to phase adjustment region 1B and DBR region 1C so as to inject current into these regions respectively. The refractive index of the DBR region 1C is changed by a control signal (i.e., control current) from frequency variation driver 6 and the optical frequency of frequency-variable light source 1 is consequently changed.

A forward-directed optical output from active region 1A is split into an output beam and a reflected beam by beam splitter 2A. The reflected beam is transformed into an electric output by beam detecting circuit 3A.

On the other hand, the backward-directed output beam, which is outputted from DBR region 1C having the selectivity of the optical frequency, is transformed into an electric output by beam detecting circuit 3B.

The electric outputs from beam detecting circuits 3A and 3B are inputted to dividing circuit 4. The dividing circuit 4 divides one electric output with the other to obtain a ratio of these outputs. The output from dividing circuit 4 is fed back to phase adjustment driver 5 as a control signal. The phase adjustment driver controls the state of phase in phase adjustment region 1B so as to correspond the amount of the feedback-input to a predetermined amount. Concretely, such phase adjustment is conducted such that phase adjustment driver 5 injects current into phase adjustment region 1B so as to change the refractive index in the region.

As a result of adjusting the phase condition, phase adjustment driver 5 is controlled in accordance with the scanning signal from frequency variation driver 6 for frequency variation, therefore, the phase-continuous frequency variation is realized while keeping the phase matching condition at the laser oscillation of frequency variable light source 1.

Figure 2:
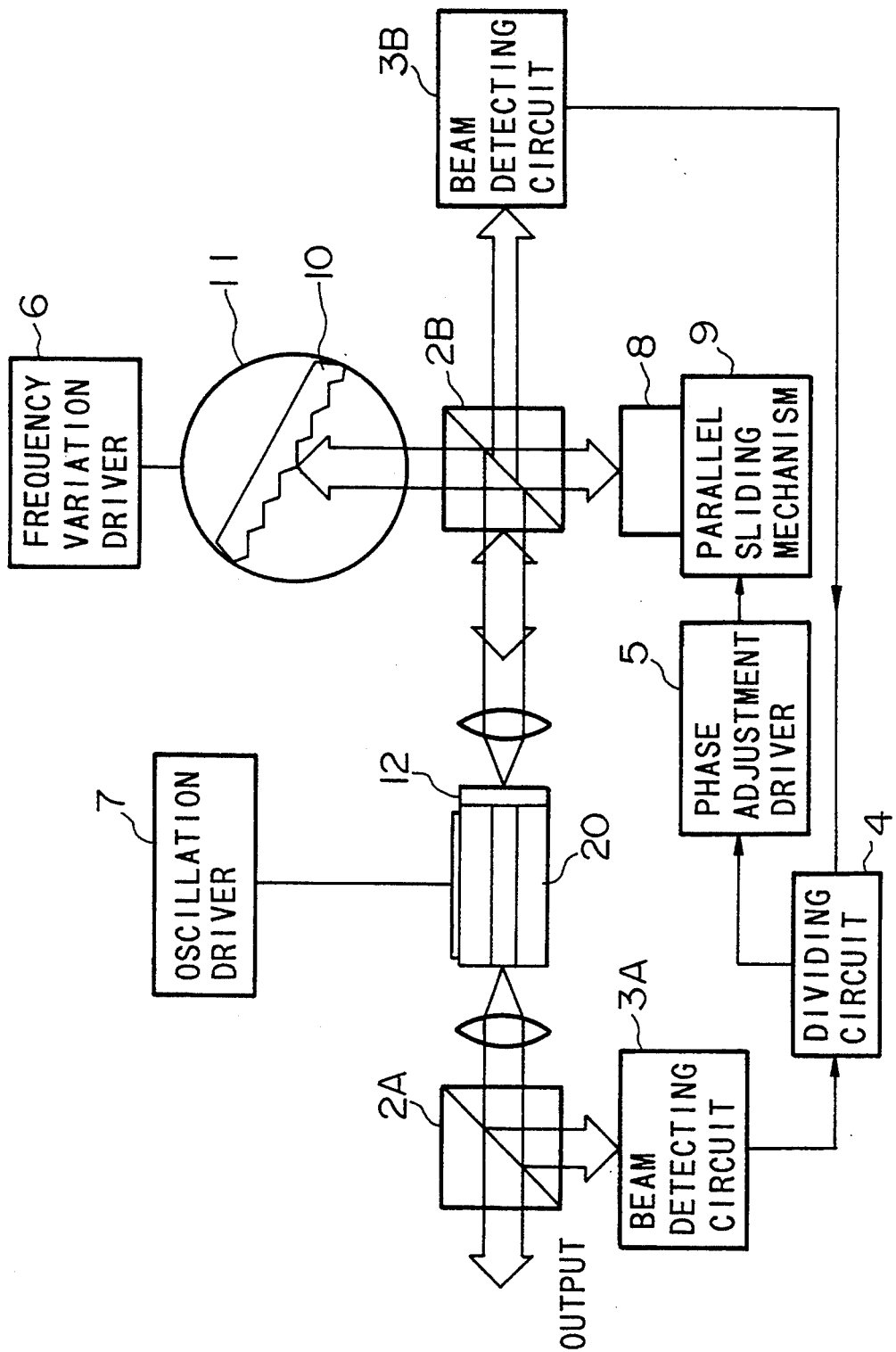
FIG. 2 is a block diagram showing the configuration of the phase-continuous and frequency-variable light source according to another embodiment of the present invention.
Figure 3:
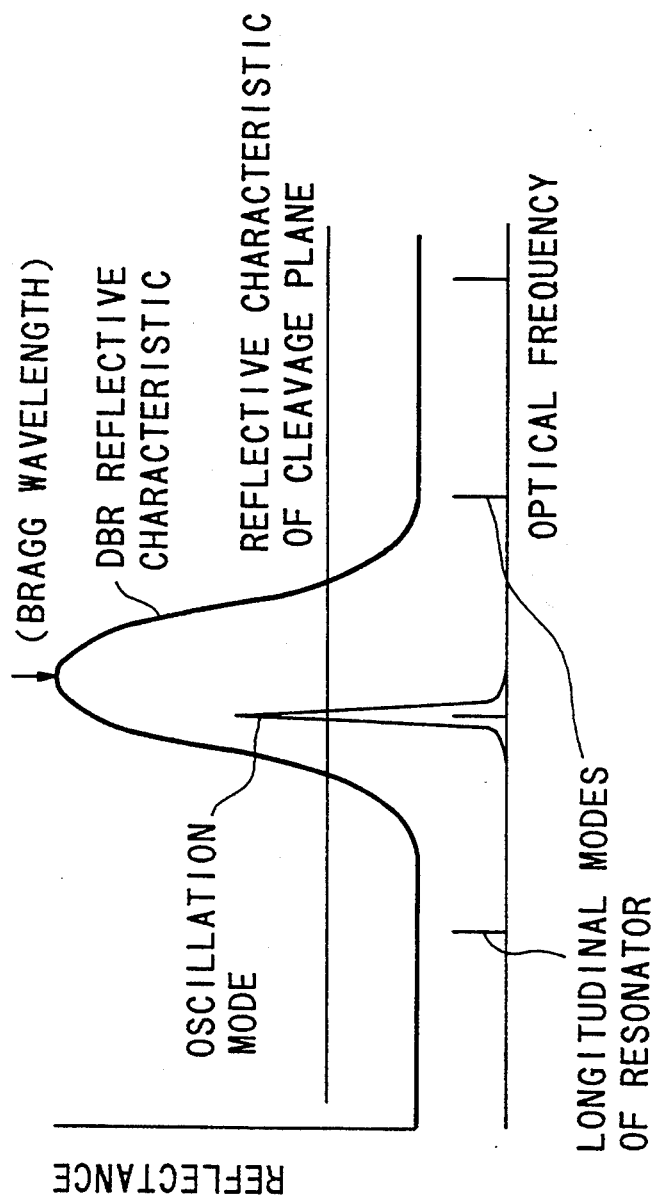
FIG. 3 is for the purpose of explaining the operation of the frequency-variable light source.

FIG. 2 is a block diagram showing the phase-continuous and frequency-variable light source according to another embodiment of the present invention.

In FIG. 2, the frequency-variable light source consists of a Fabry-Pérot type laser diode (i.e., a semiconductor laser) whose one end face has an antireflection film 12 and a ROR type external reflector (i.e., a external resonator) having a diffraction grating 10, a reflecting mirror 8, and a beam splitter 2B. The beam splitter 2B has low reflectance and transforms a resonance characteristic to a reflective characteristic.

An angle adjusting mechanism 11 is provided for diffraction grating 10. A parallel sliding mechanism 9 is provided for reflecting mirror 8 so as to slide the mirror in parallel with the longitudinal direction of the external resonator. In addition, frequency variation driver 6 and phase adjustment driver 5 are provided for the angle adjusting mechanism 11 and the parallel sliding mechanism 9 so as to drive these mechanisms. The angle of diffraction grating 10 is adjusted by a control signal from frequency variation driver 6, and according to this, the variation of the optical frequency of light source 1 is conducted.

In this embodiment, a forward-directed optical output from the end face without an antireflection film of laser diode 20 is split into an output beam and a reflected beam by beam splitter 2A. The reflected beam is transformed into an electric output by beam detecting circuit 3A.

On the other hand, the optical path of the output beam from the end face with antireflection film 12 of laser diode 20 is transformed to the direction of the resonator which includes reflecting mirror 8 and diffraction grating 10 by beam splitter 2B. The resonated beam is fed back to laser diode 20 again. Here, a part of the resonated beam is also reflected to the opposite direction to laser diode 20 by beam splitter 2B. The reflected beam is transformed into an electric output by beam detecting circuit 3B.

The electric outputs from beam detecting circuits 3A and 3B are inputted to dividing circuit 4. The dividing circuit 4 divides one electric output with the other to obtain a ratio of these outputs. The output from dividing circuit 4 is fed back to phase adjustment driver 5 as a control signal. The phase adjustment driver 5 conducts a feedback control as to correspond the input amount to a predetermined amount. Concretely, such feedback control is conducted as that reflecting mirror 8 slides in parallel according to a phase adjustment signal from phase adjustment driver 5; therefore, the length of the resonator changes and the phase condition is adjusted.

Thus, phase adjustment driver 5 is controlled in accordance with a scanning signal from frequency variation driver 6 for frequency variation; therefore, the phase-continuous frequency variation is realized while keeping the phase matching condition at the laser oscillation.

What is claimed is:

1. A phase-continuous and frequency-variable semiconductor laser light source having a laser active region, a laser phase adjustment region, and a laser DBR region having selectivity of optical frequencies, the phase-continuous and frequency-variable semiconductor laser light source comprising:
   a beam splitter for splitting a forward-directed beam from the laser active region into an outputted beam and a reflected beam;
   a first beam detecting circuit for detecting an optical input of the reflected beam from the beam splitter and transforming the detected optical input into an electric output;
   a second beam detecting circuit for detecting an optical input of the backward-directed beam from the laser DBR region and transforming the detected optical input into an electric output; and
   a control circuit for controlling a phase condition of the laser phase adjustment region in a manner such that a ratio of the electric outputs from the first and second beam detecting circuits is fixed to a predetermined value.

2. An external resonator type phase-continuous and frequency-variable light source having an external resonator which includes a first beam splitter, a reflecting mirror, and a diffraction grating, wherein an output beam from an end face with an antireflection film of a laser diode of the light source is split by the first beam splitter so as to input the beam to the reflection mirror, and a reflected beam from the reflection mirror is transmitted through the first beam splitter so as to input the reflected beam to the diffraction grating, the phase continuous and frequency variable light source comprising:

a second beam splitter for splitting a forwards-directed beam from the laser diode into an outputted beam and a reflected beam;

a first beam detecting circuit for detecting an optical input of one of the beams from the second beam splitter and transforming the detected optical input into an electric output;

a second beam detecting circuit for detecting an optical input of a transmitted beam from the first beam splitter and transforming the detected optical input into an electric output; and a control circuit for controlling a phase condition of the light source by sliding the reflecting mirror in parallel with a longitudinal direction of the external resonator so as to change a length of the external resonator in a manner such that a ratio of the electric outputs from the first and second beam detecting circuits is fixed to a predetermined value.

* * * * *